United States Patent [19]
Satou et al.

[11] Patent Number: 4,825,270
[45] Date of Patent: Apr. 25, 1989

[54] GATE TURN-OFF THYRISTOR

[75] Inventors: Yukimasa Satou; Tsutomu Yatsuo; Saburo Oikawa, all of Hitachi; Isamu Sanpei, Kitaibaraki, all of Japan

[73] Assignee: Hitachi, Ltd., Tokyo, Japan

[21] Appl. No.: 9,479

[22] Filed: Feb. 2, 1987

[30] Foreign Application Priority Data

Jan. 31, 1986 [JP] Japan .................................. 61-17965

[51] Int. Cl.⁴ .............................................. H01L 29/74
[52] U.S. Cl. ........................................ 357/38; 357/20; 357/22; 357/56; 357/86; 357/89
[58] Field of Search ........................ 357/38, 20, 89, 86, 357/56, 22

[56] References Cited

U.S. PATENT DOCUMENTS 4,177,478 12/1979 Senes ...................................... 357/38

FOREIGN PATENT DOCUMENTS 2377095 8/1978 France .
51-11578 1/1976 Japan .
55-10984 3/1980 Japan .
55-160468 12/1980 Japan .
59-194470 11/1984 Japan .

*Primary Examiner*—Joseph E. Clawson, Jr.
*Attorney, Agent, or Firm*—Antonelli, Terry & Wands

[57] ABSTRACT

The present invention relates to a buried gate type gate turn-off thyristor. A low-resistance layer which is buried in a cathode base layer has a multiplicity of small bores below a cathode emitter layer. The distance between each pair of adjacent small bores and the thickness of the low-resistance layer are each set so as to be smaller than the carrier diffusion length in an anode base layer. In an on-state, carries flow through the low-resistance layer, thereby allowing the low-resistance layer to become conductive, and thus lowering the on-state voltage. A reduction in the dimension of the small bores lowers the resistance of the low-resistance layer and hence lowers the gate drawing out resistance, so that the interrupting capacity is improved. When gate turn-off thyristor is arranged so as to have an amplifying gate structure, the distance between each pair of adjacent small bores in the amplifying auxiliary thyristor section is set so as to be greater than the carrier diffusion length in the anode base layer. In consequence, the on-state voltage in the auxiliary thyristor section is increased, so that the current selectively flows through the main thyristor section, and the auxiliary thyristor section automatically turns off. Accordingly, when the thyristor is to be turned off, it suffices to turn off the main thyristor section alone.

3 Claims, 2 Drawing Sheets

GATE TURN-OFF THYRISTOR

BACKGROUND OF THE INVENTION

The present invention relates to a gate turn-off thyristor (hereinafter abbreviated to GTO). More particularly, the present invention pertains to a junction structure which is suitable for improving the interrupting capacity of a buried gate type GTO without increasing the on-state voltage.

GTO is one type of thyristor that can be turned on or off in response to the gate signal and can control large electric power as compared with transistors. To improve the interrupting capacity of GTO, it is effective practice to reduce the transverse resistance of the cathode base layer and thereby to enable the gate turn-off current to be readily drawn out, and to increase the reverse breakdown voltage between the gate and the cathode and thereby to allow the power supply voltage of the gate circuit to be increased. One example of the conventional junction structure which enables both the above-described requirements to be satisfied simultaneously is a so-called buried-gate structure such as those disclosed in the specifications of Japanese Pat. Publication No. 10984/1980 and Japanese Pat. Laid-Open No. 11578/1976. In this type of conventional junction structure, the cathode base layer is provided therein with a partial semiconductor layer which has the same conductivity type as that of the cathode base layer and which has a relatively low resistance, that is, a heavily doped semiconductor layer, and this semiconductor layer is connected to the gate terminal, from which the gate turn-off current is drawn out. This structure enables the transverse resistance of the cathode base layer to be substantially reduced. Since this conventional structure allows a lowering of the impurity concentration of the cathode base layer around the low-resistance layer, it is possible to increase the reverse breakdown voltage between the gate and the cathode at the same time.

Hitherto, the above-described low-resistance layer has the structure in which a multiplicity of elongated strip-shaped slits are provided as described in the material EDD-82-66 furnished at a study meeting of the electrical society. The cathode gate layer extends through the slits in the low-resistance layer to define the passage of main current in an on-state. This is because carriers injected into the cathode base layer from the cathode emitter layer disappear in the low-resistance layer.

In order to further improve the interrupting capacity in the conventional low-resistance layer structure, it is necessary to narrow the width of the slits, but if the slits are narrowed, the conducting area in an on-state is reduced, and the on-state voltage is increased undesirably. The conducting area can be enlarged by increasing the number of slits. However, an increase in the number of slits reduces the width of a portion of the low-resistance layer which is present between each pair of adjacent slits, resulting in an increase in the gate drawing out resistance and a lowering of the interrupting capacity. Thus, the conventional low-resistance layer structure involves the problem that it is difficult to improve the interrupting capacity without increasing the on-state voltage.

SUMMARY OF THE INVENTION

Accordingly, it is an object of the present invention to provide a buried gate type GTO which has an increased interrupting capacity and a lowered on-state voltage.

It is another object of the present invention to provide a GTO of the amplifying gate structure which has an increased interrupting capacity and in which the amplifying gate portion automatically turns off.

To these ends, according to the present invention, the passage of main current in the low-resistance layer is defined by a multiplicity of small bores in place of the conventional elongated strip-shaped slits, while the distance between each pair of adjacent small bores is set so as to be shorter than the carrier diffusion length in the anode base layer, and the thickness of the low-resistance layer in the direction in which the main current passage extends is set so as to be shorter than said carrier diffusion length.

When the main current passage is defined by small bores, the conducting area in the low-resistance layer is reduced. However, carriers injected into the anode base layer spread transversely as much as the diffusion length. Therefore, the carriers pass through the low-resistance layer, and the substantial conducting area is larger than the total area of the small bores. Accordingly, in a region wherein the distance between each pair of adjacent small bores is set so as to be shorter than the carrier diffusion length in the anode base layer, not only portions of the anode base layer which are directly below the small bores but also portions of the layer which are directly below portions of the low-resistance layer which are interposed between the small bores are in a conducting state. More specifically, a portion of the low resistance layer which is interposed between each pair of adjacent small bores does not contribute to a reduction in the conducting area. In other words, provision of such low resistance layer leads no increase in the on-state voltage. Further, the interrupting capacity can be improved by reducing the dimensions of the small bores and thereby lowering the gate drawing out resistance.

DESCRIPTION OF THE PREFERRED EMBODIMENTS

Figure 1:
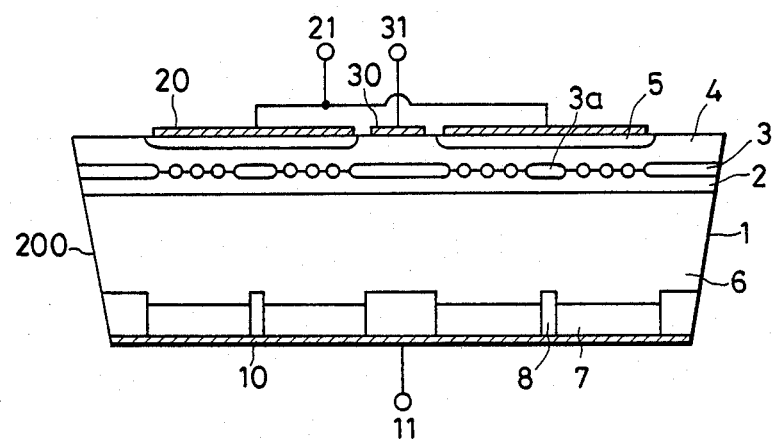
FIG. 1 is a sectional view of one embodiment of the GTO according to the present invention.

One embodiment of the present invention will be described hereinunder with reference to the accompanying drawings. Throughout the drawings, the same or corresponding members or portions are denoted by the same reference numerals.

FIG. 1 is a sectional view of a GTO according to the present invention. In an n-type semiconductor wafer (substrate) 1, a p-type cathode base layer 2 is formed by diffusion of boron or the like, and a p-type low-resistance layer 3 is formed in the layer 2 by selective diffusion, the layer 3 having a higher impurity concentration than that of the layer 2. Then, a p-type epitaxial semiconductor layer 4 which has a lower impurity concentration than that of the p-type cathode base layer 2 is grown. Further, an n-type cathode emitter layer 5 is formed in the p-type semiconductor layer 4 by diffusion of phosphorous or the like. A p-type anode emitter layer 7 which is adjacent to an n-type anode base layer 6 is formed by diffusion of boron or the like in a manner similar to that of the p-type cathode base layer 2. The n-type anode base layer 6 is, together with the p-type anode emitter layer 7, in low-resistance contact with an anode electrode 10 through an n-type heavily doped layer 8, thus forming a so-called anode-emitter shorted structure.

The p-type anode emitter layer 7, the n-type anode base layer 6, the p-type cathode base layer 2 and the n-type cathode emitter layer 5, and the n-type heavily doped layer 8 which is a part of the n-type anode base layer 6, and the p-type low-resistance layer 3 and the p-type lightly doped layer 4 each of which is a part of the p-type cathode base layer 2 constitute in combination a semiconductor substrate 200 having a pnpn structure consisting of four alternating p- and n-type layers from the anode electrode 10 side toward a cathode electrode (described later). The p-type low-resistance layer 3 is isolated from the n-type anode base layer 6 and the n-type cathode emitter layer 5. The p-type cathode base layer 2 has a higher impurity concentration than that of the n-type anode base layer 6. The p-type lightly doped layer 4 has an impurity concentration equal to or lower than that of the p-type cathode base layer 2. The n-type cathode emitter layer 5 has a higher impurity concentration than that of the p-type lightly doped layer 4. The p-type anode emitter layer 7 has a higher impurity concentration than that of the n-type anode base layer 6.

The p-type anode emitter layer 7 and the n-type heavily doped layer 8 are exposed at the lower principal surface of a pair of opposing principal surfaces of the semiconductors substrate 200, and the n-type cathode emitter layer 5 and the p-type lightly doped layer 4 are exposed at the upper principal surface.

A cathode electrode 20 and a gate electrode 30 are brought into low-resistance contact with the exposed surfaces of the n-type cathode emitter layer 5 and the p-type cathode base layer 2, respectively. The anode electrode 10, the cathode electrode 20 and the gate electrode 30 are respectively connected to an anode terminal 11, a cathode terminal 21 and a gate terminal 31. Although not illustrated, the surface where the pn junction is exposed is covered with a surface stabilizing film such as a silicon oxide film, a glass film or silicone rubber film.

Figure 2:
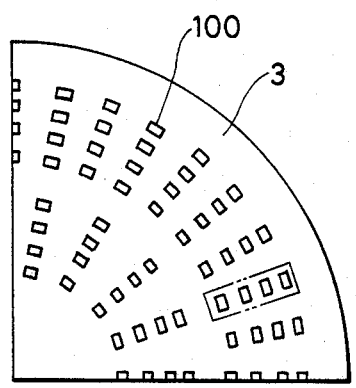
FIG. 2 shows a quarter of the low-resistance layer pattern.
Figure 3:
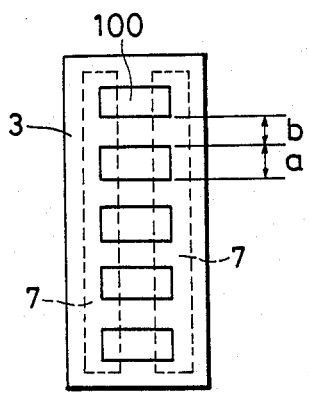
FIG. 3 is an enlarged view of a part of the low-resistance layer pattern shown in FIG. 2.

FIG. 2 is a plane view of the p-type low-resistance layer 3, which shows a quarter of the disk-shaped pattern of the layer 3. FIG. 3 is an enlarged view of the one-dot chain line part of the pattern shown in FIG. 2. The cathode emitter layer 5 has an annular shape, and a multiplicity of small bores 100 are disposed radially in a multi-ring pattern. Portions designated by the dotted line are the p-type anode emitter layers 7 which are disposed radially in such a manner as to cross the small bores 100. In a region shown in an enlarged view of FIG. 3, the distance b between each pair of adjacent small bores 100 is set so as to be shorter than the carrier diffusion length in the n-type anode base layer 6.

It is not necessary to set all the distances b so as to be shorter than the carrier diffusion length in the layer 6. A p-type low-resistance layer portion 3a shown in FIG. 1 is located directly below the n-type cathode emitter layer 5, but the length of the portion 3a, that is, the distance between a pair of small bores 100 opposing each other across the portion 3a is longer than the carrier diffusion length in the n-type anode base layer 6.

In a forward blocking state wherein a voltage is applied so that the anode electrode 10 is positive in potential with respect to the cathode electrode 20, if a gate turn-on signal is applied to the gate electrode 30 at a voltage with which the gate electrode 30 is positive in potential with respect to the cathode electrode 20, the GTO turns on. Since the GTO has a pnpn structure which consists of four alternate layers of two different conductivity types, latchup occurs, and therefore even if the gate turn-on signal is removed, a current continues to flow through the GTO. If, in an onstate, a gate turn-off signal is applied to the gate electrode 30 at a voltage with which the cathode electrode 20 is positive in potential with respect to the gate electrode 30, carriers are drawn out from the gate electrode 30 through the p-type low-resistance layer 3, and the GTO turns off.

Figure 4:
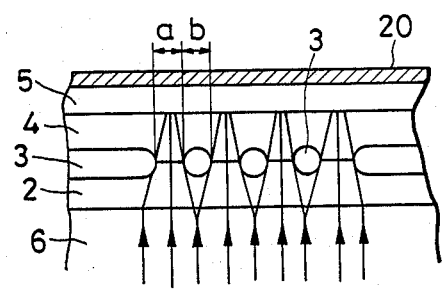
FIG. 4 is a view employed to describe the operation of the embodiment shown in FIG. 1.

The operation of this embodiment will be described below in detail with reference to FIG. 4. In the figure, the way in which a current flows in an on-state is shown by lines of flow provided with arrow heads. Within the n-type anode base layer 6, the current flows while spreading transversely as such as the carrier diffusion length in the layer 6 which is greater than the dimension a of the small bores 100. In other words, the carriers flow through the low-resistance layer 3. This is because the carriers injected from the cathode emitter layer 5 do not disappear since the thickness of the low-resistance layer 3 is smaller than the carrier diffusion length, although the layer 3 is heavily doped. Accordingly, since the distance b between each pair of adjacent small bores 100 is set so as to be smaller than the carrier diffusion length in the n-type anode base layer 6 as described above, a portion of the n-type anode base layer 6 which is directly below each portion of the p-type low-resistance layer 3 which is between a pair of adjacent small bores 100 is also in a conducting state. Therefore, the substantial conducting area is the same as that in the case where portions (indicated by the dimension b in FIG. 4) of the p-type low-resistance layer 3 which are between the small bores 100 are not present. Thus, provision of such low-resistance layer causes no increase in the on-state voltage. On the other hand, when the dimension a of the small bores 100 is reduced, the gate drawing out resistance is lowered, so that it is possible to increase the gate turn-off current and improve the interrupting capacity. This embodiment, which uses the anode-emitter shorted structure in combination with the above-described junction structure, enables the interrupting capacity to be improved without increasing the on-state voltage, advantageously.

The same junction structure as that in accordance with this embodiment was applied to an element in which a=b=40 μm, the diameter was 30 mm and the dielectric strength was 4.5 kV to measure the on-state voltage and the interrupting current. The on-state voltage in the case of a supply current of 300A was 2.5 V, which is substantially equal to that of the conventional elements, but the maximum interrupting current was about 2,000A, which is approximately twice that of the conventional elements.

A portion of the low-resistance layer 3 between a pair of small bores 100 which has a length b greater than the carrier diffusion length in the anode base layer 6 does not contribute to conduction of the current but constitutes a non-conducting region and acts to increase the on-state voltage. Accordingly, the ratio between the total area of portions of the low-resistance layer 3 whose length b is greater than the carrier diffusion length in the layer 6 and the total area of portions of the layer 3 whose length b is shorter than the carrier diffusion length is determined on the basis of the consideration of the balance between the on-state voltage and the interrupting capacity.

When the whole of the semiconductor substrate 200 is subjected to a means for reducing the lifetime of carriers, for example, irradiation with an electron beam or doping of a lifetime killer such as gold, the distance b of the low resistance layer 3 between each pair of adjacent small bores 100 is made smaller than that in the case where the substrate 200 is subjected to no means for reducing the carrier lifetime in conformity with the reduced carrier diffusion length.

Although in the embodiment shown in FIG. 1, the anode emitter layer is shorted by the anode electrode 10, the anode emitter layer may exist all over the lower principal surface of the semiconductor substrate 200 and may be of the nonemitter shorted type. Further, the present invention may also be applied to a GTO having the amplifying gate structure.

Figure 5:
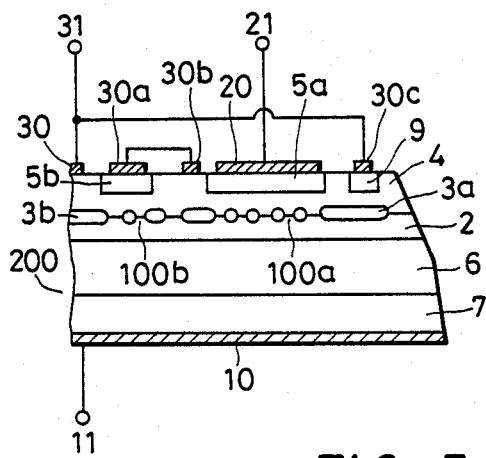
FIG. 5 is a fragmentary sectional view of another embodiment of the GTO according to the present invention.

FIG. 5 shows an amplifying gate and non-emitter shorted type GTO according to the present invention. In FIG. 5, members or portions which are identical or corresponding to those shown in FIG. 1 are denoted by the same reference numerals. In FIG. 5, the reference numeral 30 denotes a gate electrode for turning on the GTO, and the numerals 30a and 30b denote amplifying gate electrodes. The gate electrode 30a is in low-resistance contact with an auxiliary n-type cathode emitter layer 5b, while the gate electrode 30b is in low-resistance contact with the lightly doped layer 4, and the gate electrodes 30a and 30b are electrically connected to each other.

A gate electrode 30c for turning off the GTO is in low-resistance contact with an n-type auxiliary layer 9 which is provided in the lightly doped layer 4. The low-resistance layer is divided into a region 3a below the n-type auxiliary cathode emitter layer 5a and a region 3b below the n-type auxiliary cathode emitter layer 5b. The low-resistance layers 3a and 3b have small bores 100a and 100b, respectively. The distance between each pair of adjacent small bores 100a and 100b is set so as to be shorter than the carrier diffusion length in the n-type anode base layer 6, and the thickness of the low-resistance layers 3a and 3b is set so as to be smaller than said carrier diffusion length.

Since the p-type anode emitter layer is not shorted, this type of GTO has a reverse blocking capacity.

When a turn-on signal is applied to the gate terminal 31, carriers are injected from the auxiliary cathode emitter layer 5b, and an auxiliary thyristor formed between the gate electrode 30a and the anode electrode 10 is fired or turned on. The current flowing at this time is supplied from the gate electrode 30b to the cathode emitter layer 5a, and a main thyristor formed between the cathode electrode 20 and the anode electrode 10 is thereby turned on. At this time, the pn junction between the n-type auxiliary layer 9 and the lightly doped layer 4 is reverse-biased. Therefore, there is no fear of the main thyristor being directly turned on.

When a turn-off signal is applied to the gate electrode 30c, the pn junction between the n-type auxiliary layer 9 and the lightly doped layer 4 is forward-biased, so that carriers are drawn out through the low-resistance layer 3a, and the GTO is thereby turned off.

When the distance of a portion of the low-resistance layer 3b between each pair of small bores in the auxiliary thyristor is set so as to be greater than the carrier diffusion length in the anode base layer 6, the on-state voltage in the auxiliary thyristor becomes higher than that in the main thyristor, so that it becomes relatively difficult for the auxiliary thyristor to conduct, and when the main thyristor turns on, the auxiliary thyristor automatically turns off. Accordingly, when the GTO is to be turned off, it suffices to turn off the main thyristor alone.

When the distance of a portion of the low-resistance layer between each pair of adjacent small bores in the auxiliary thyristor section is equal to that in the main thyristor section as described above, a means for enabling also the auxiliary thyristor to turn off, e.g., a diode, is inserted in such a direction that the current flows from the gate electrodes 30a and 30b to the gate electrode 30.

Although in the embodiment shown in FIG. 1 the cathode emitter layer 5 has an annular shape, it may be divided into strip-shaped portions which are arranged radially. One example of such pattern of the cathode emitter layer 5 is illustrated in FIG. 6.

Figure 6:
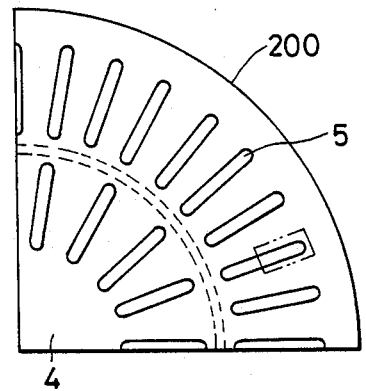
FIG. 6 shows a quarter of the pattern formed on the cathode-side principal surface.
Figure 7:
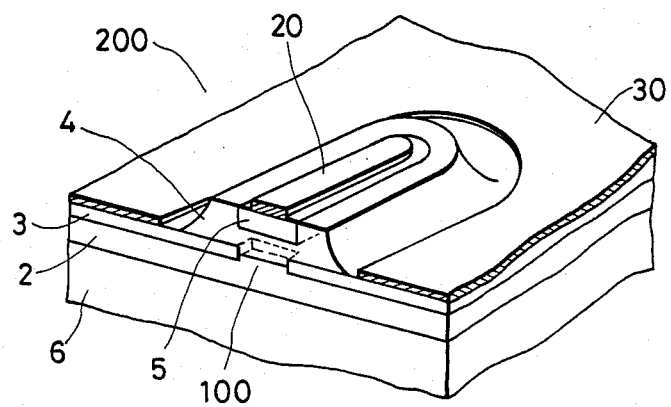
FIG. 7 is an enlarged perspective view of the one-dot chain line part of the pattern shown in FIG. 6.

FIG. 6 shows the cathode-side principal surface of the disk-shaped semiconductor substrate 200, on which the cathode emitter layer 5 is divided into strip-shaped portions which are arranged radially. Each cathode emitter layer 5 is formed in the lightly doped layer 4 by diffusion of an impurity. A portion of a cathode emitter layer 5 indicated by the one-dot chain line is enlarged and shown in FIG. 7 which is an enlarged perspective view thereof. The pattern of the low-resistance layer 3 is the same as that in accordance with the embodiment shown in FIG. 2. Although in the embodiment shown in FIG. 1 the upper principal surface of the GTO is flat, the upper principal surface of the GTO in accordance with the embodiment shown in FIG. 7 is uneven. More specifically, the lightly doped layer 4 projects in the shape of a mesa, and a strip-shaped n-type cathode emitter layer 5 is provided in the mesa in such a manner as to define a planar junction. The low-resistance layer 3 is exposed at the foot of the mesa of the lightly doped layer 4, and the gate electrode 30 is in low-resistance contact with the low-resistance layer 3.

The distance between each pair of adjacent small bores 100 and the thickness of the low-resistance layer 3 are each set so as to be smaller than the carrier diffusion length in the n-type anode base layer 6. Since the gate electrode 30 is in direct low-resistance contact with the low-resistance layer 3, the gate drawing out resistance is lower than that in the embodiment shown in FIG. 1, and the interrupting capacity is therefore improved.

With this junction structure, when the capacity of the GTO is increased and the strip-shaped n-type cathode emitter layers are arranged radially in a multi-ring pattern (in FIG. 6, they are arranged in a double ring pattern), if the gate lead is disposed at a position between the rings as shown by the dotted line in FIG. 6, the gate drawing out resistance is further lowered. In the case of a relatively small capacity, the gate lead may be connected to the center of the semiconductor substrate 200 in a manner similar to that in the embodiment shown in FIG. 1.

The n-type cathode emitter layer is not necessarily needed to be formed into a strip-shaped pattern and may be formed into any desired pattern. Further, the semiconductor substrate may be rectangular.

According to the present invention, it is possible to lower the gate drawing out resistance without reducing the substantial conducting area. It is therefore possible to improve the interrupting capacity of the buried gate type GTO without increasing the on-state voltage.

What is claimed is:

1. A gate turn-off thyristor comprising:
   a. a semiconductor substrate having
      (i) four alternate layers of two different conductivity types disposed between a pair of opposing principal surfaces, the first layer being exposed at one principal surface, and the fourth layer, together with the third layer, being exposed at the other principal surface,
      (ii) the third layer having a low-resistance layer provided therein, said low-resistance layer being separate from the second and fourth layers and having the same conductivity type as that of the third layer,
      (iii) said low-resistance layer having a multiplicity of small bores, the third layer extending through said small bores, said low-resistance layer having a thickness which is smaller than the carrier diffusion length in the second layer, and
      (iv) the distance between each pair of adjacent small bores being set so as to be smaller than the carrier diffusion length in the second layer;
   b. an anode electrode which is in low-resistance contact with the first layer;
   c. a gate electrode which is in low-resistance contact with the third layer; and
   d. a cathode electrode which is in low-resistance contact with the fourth layer.

2. A gate turn-off thyristor according to claim 1, wherein the fourth layer is divided into strip-shaped portions, said cathode electrode being in low-resistance contact with each strip-shaped fourth layer.

3. A gate turn-off thyristor according to claim 1, wherein the third layer has first and second auxiliary layers provided therein in such a manner that said auxiliary layers are exposed at said second principal surface and separate from the fourth layer, said auxiliary layers having the same conductivity type as that of the fourth layer, said first auxiliary layer having means for electrically connecting said first auxiliary layer and the third layer, and said second auxiliary layer having means for electrically connecting said second auxiliary layer and said gate electrode.

* * * * *